(12) United States Patent
Ogawa

(10) Patent No.: US 11,515,153 B2
(45) Date of Patent: Nov. 29, 2022

(54) FILM FORMING APPARATUS AND FILM FORMING METHOD

(71) Applicant: TOKYO ELECTRON LIMITED, Tokyo (JP)

(72) Inventor: Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 167 days.

(21) Appl. No.: 17/006,245

(22) Filed: Aug. 28, 2020

(65) Prior Publication Data

US 2021/0066067 A1    Mar. 4, 2021

(30) Foreign Application Priority Data

Aug. 30, 2019  (JP) .............................. JP2019-158683

(51) Int. Cl.
*H01L 21/02* (2006.01)
*C23C 16/34* (2006.01)
*C23C 16/52* (2006.01)
*C23C 16/56* (2006.01)
*C23C 16/455* (2006.01)

(52) U.S. Cl.
CPC ........ *H01L 21/0228* (2013.01); *C23C 16/345* (2013.01); *C23C 16/45536* (2013.01); *C23C 16/52* (2013.01); *C23C 16/56* (2013.01); *H01L 21/02167* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 2013/0210241 A1* | 8/2013 | LaVoie | H01L 21/0217 257/E21.24 |
| 2014/0134827 A1* | 5/2014 | Swaminathan | H01L 21/02274 156/345.24 |
| 2015/0064908 A1 | 3/2015 | Moriya et al. | |
| 2016/0362789 A1* | 12/2016 | Yoshikawa | C23C 16/45551 |

FOREIGN PATENT DOCUMENTS

JP       2019-33229 A       2/2019

* cited by examiner

*Primary Examiner* — Asok K Sarkar
(74) *Attorney, Agent, or Firm* — Nath, Goldberg & Meyer; Jerald L. Meyer; Tanya E. Harkins

(57) ABSTRACT

A method of forming a silicon nitride film on a substrate having a recess pattern formed in a surface thereof, includes: forming the silicon nitride film in conformity to the surface of the substrate by supplying each of a raw material gas containing silicon and a nitriding gas for nitriding the raw material gas into a processing container in which the substrate is accommodated; shrinking the silicon nitride film such that a thickness thereof is reduced from a bottom side toward an upper side of the recess pattern by supplying a plasmarized shaping gas for shaping the silicon nitride film to the substrate in a state where the supply of the raw material gas containing silicon into the processing container is stopped; and burying the silicon nitride film in the recess pattern by alternately and repeatedly performing the forming the silicon nitride film and the shrinking the silicon nitride film.

7 Claims, 13 Drawing Sheets

|  | Film formation | Shrinkage | Film formation | Shrinkage |  |
|---|---|---|---|---|---|
| R0 | DCS | Off | DCS | Off | --- |
| R1 R2 | Plasma process $H_2$ | Plasma process $H_2$ | Plasma process $H_2$ | Plasma process $H_2$ | --- |
| R3 | Plasma process $NH_3+H_2$ | Plasma process $H_2$ | Plasma process $NH_3+H_2$ | Plasma process $H_2$ | --- |

FILM FORMING APPARATUS AND FILM FORMING METHOD

CROSS-REFERENCE TO RELATED APPLICATION

This application is based upon and claims the benefit of priority from Japanese Patent Application No. 2019-158683, filed on Aug. 30, 2019, the entire contents of which are incorporated herein by reference.

TECHNICAL FIELD

The present disclosure relates to a film forming apparatus and a film forming method.

BACKGROUND

In a process of manufacturing a semiconductor device, various films, such as a $Si_3N_4$ (hereinafter, referred to as "silicon nitride" or "SiN") film, are formed on a semiconductor wafer (hereinafter, referred to as a "wafer") which is, for example, a substrate. Such a film-forming process is performed by a method called, for example, atomic layer deposition (ALD), in which a raw material gas and a reaction gas are alternately supplied to the wafer multiple times. As a film forming apparatus for performing the ALD, for example, as disclosed in Patent Document 1, there is known an apparatus in which a wafer is placed on a rotary table provided within a vacuum container and which is configured such that a wafer revolving with rotation of the rotary table repeatedly passes through a processing region having an atmosphere in which the raw material gas is supplied and a processing region having an atmosphere in which the reaction gas is supplied. In addition to the raw material gas atmosphere and the reaction gas atmosphere, a predetermined region in which a modifying gas for modifying a film is supplied toward the rotary table is formed. Each of the reaction gas and the modifying gas is supplied to the predetermined region. In addition, a separation region to which a separation gas is supplied is formed so as to partition these processing regions.

In forming such a SiN film, the SiN film may be formed so as to fill a recess pattern formed in the surface of the wafer, for example, as disclosed in Patent Document 1. Thus, it is required to fill the recess pattern such that a gap called a void or seam does not occur inside the recess pattern.

PRIOR ART DOCUMENT

Patent Document

Patent Document 1: Japanese Laid-Open Patent Publication No. 2019-033229

SUMMARY

According to one embodiment of the present disclosure, there is provided a method of forming a silicon nitride film on a substrate having a recess pattern formed in a surface of the substrate, the method including: forming the silicon nitride film in conformity to the surface of the substrate by supplying each of a raw material gas containing silicon and a nitriding gas for nitriding the raw material gas into a processing container in which the substrate is accommodated; shrinking the silicon nitride film such that a thickness of the silicon nitride film is reduced from a bottom side of the recess pattern toward an upper side of the recess pattern by supplying a plasmarized shaping gas for shaping the silicon nitride film to the substrate in a state in which the supply of the raw material gas containing silicon into the processing container is stopped; and burying the silicon nitride film in the recess pattern by alternately and repeatedly performing the forming the silicon nitride film and the shrinking the silicon nitride film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
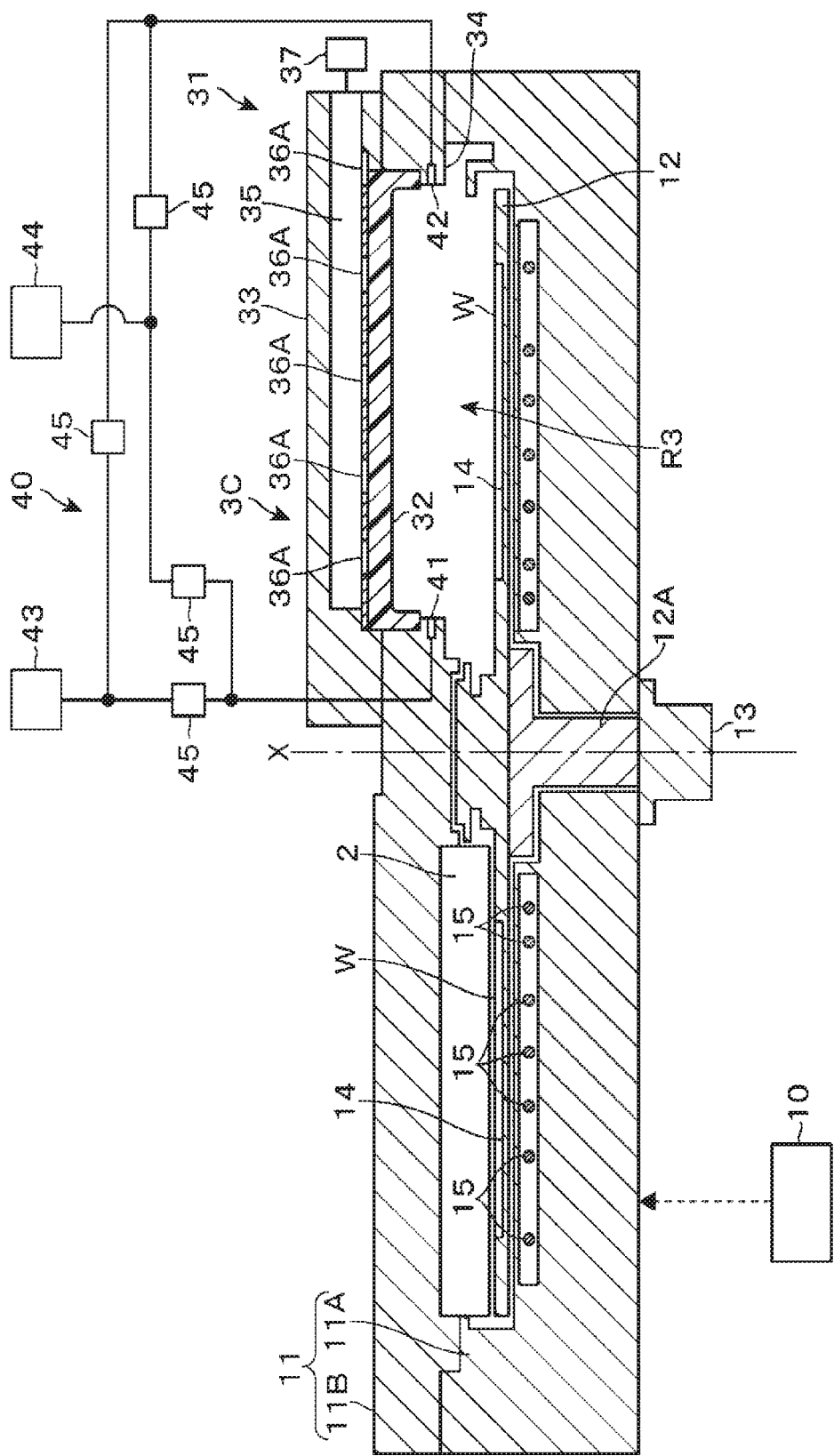
FIG. 1 is a vertical cross-sectional view illustrating an example of a film forming apparatus according to an embodiment of the present disclosure.

A film forming apparatus according to an embodiment of the present disclosure will be described with reference to a vertical cross-sectional view of FIG. 1 and a horizontal cross-sectional view of FIG. 2. The film forming apparatus is configured to form a SiN film on a surface of a semiconductor wafer (hereinafter referred to as a wafer) W as a substrate using an atomic layer deposition (ALD). In this specification, silicon nitride is referred to as SiN regardless of the stoichiometric ratio thereof. Accordingly, the description of SiN includes, for example, $Si_3N_4$.

The film forming apparatus includes a flat vacuum container 11 having a substantially circular shape, which is a processing container for accommodating a wafer W. The vacuum container 11 includes a container body 11A having a side wall and a bottom, and a top plate 11B. A circular rotary table 12 on which the wafer W having a diameter of 300 mm is placed is provided inside the vacuum container 11. In the figure, reference numeral 12A denotes a support that supports the central portion of a rear surface of the rotary table 12. A rotation mechanism 13 is provided below the support 12A. The rotary table 12 rotates in the clockwise direction, when viewed from above, about a vertical axis via the support 12A during the film-forming process. Symbol X in the figure denotes a rotational axis of the rotary table 12.

Figure 2:
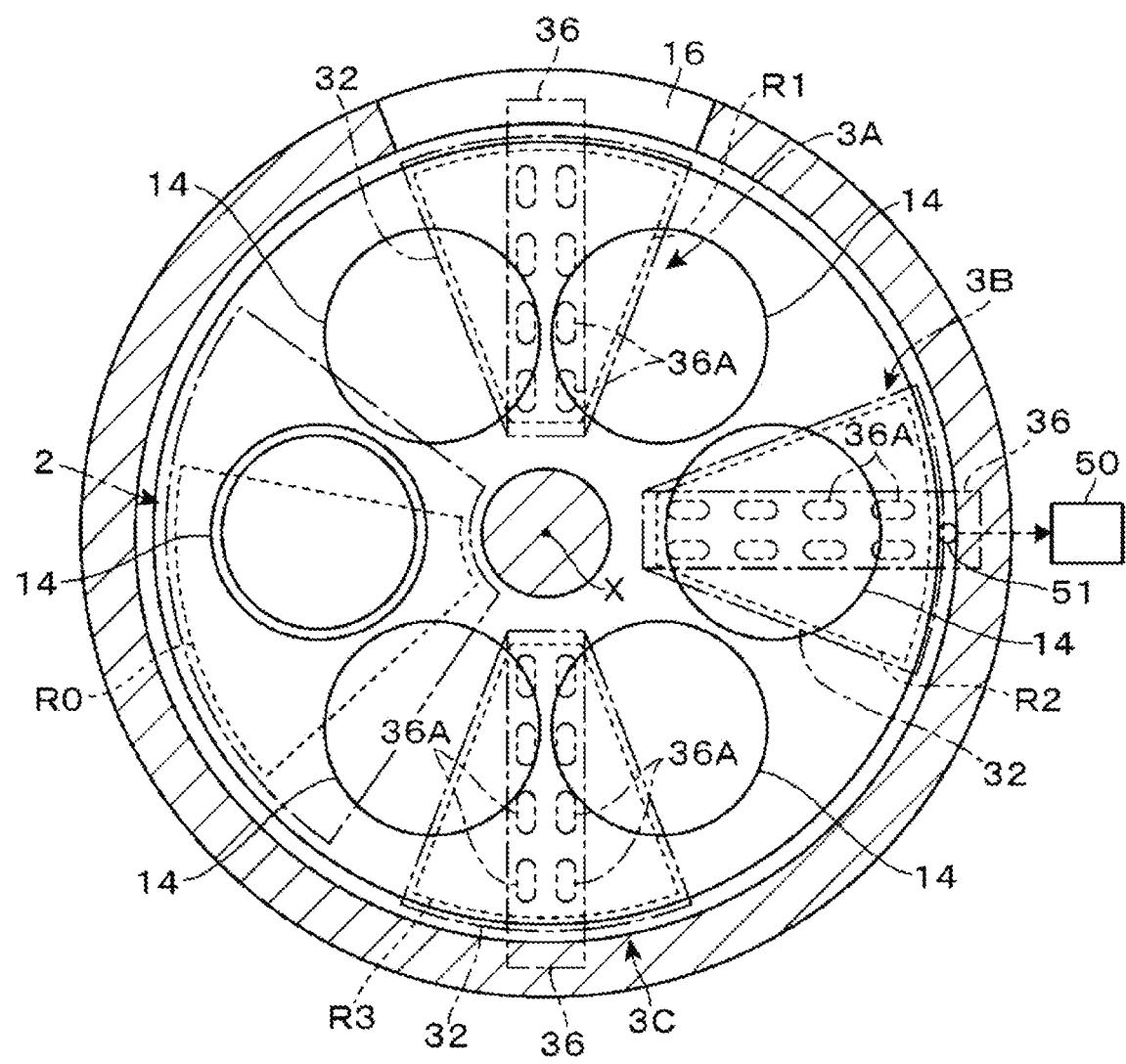
FIG. 2 is a horizontal cross-sectional view of the example of the film forming apparatus.

As illustrated in FIG. 2, six circular recesses 14 as wafer placement portions are provided in an upper surface of the rotary table 12 along the circumferential direction (rotational direction) of the rotary table 12. A plurality of wafers W is accommodated in the respective recesses 14. That is, each wafer W is placed on the rotary table 12 so as to revolve with the rotation of the rotary table 12. Returning back to FIG. 1, a plurality of heaters 15 is provided in a concentric relationship below the rotary table 12 in the bottom portion of the vacuum container 11 so that the wafers W placed on the rotary table 12 are heated. In addition, as illustrated in FIG. 2, a transfer port 16 through which the wafer W is transferred is opened in the side wall of the vacuum container 11, and is configured to be opened/closed by a gate valve (not illustrated). A position facing the transfer port 16 inside the vacuum container 11 is a delivery position at which the wafer W is delivered. In a portion corresponding to the delivery position, delivery lifting pins (not illustrated) for lifting up the wafer W from the rear surface thereof through the recess 14 and a lifting mechanism (not illustrated) for the lifting pins are provided below the rotary table 12. The wafer W is transferred to the delivery position through the transfer port 16 by a substrate transfer mechanism (not illustrated) provided outside the vacuum container 11, and is delivered to the recess 14 in cooperation between the substrate transfer mechanism and the lifting pins.

As illustrated in FIG. 2, a gas supply/exhaust unit 2 and plasma-forming units 3A to 3C are sequentially provided in the clockwise direction above the rotary table 12. In addition, an exhaust port 51 is opened below the outer side of the rotary table 12 in the vacuum container 11 and outside the plasma-forming unit 3B. The exhaust port 51 is connected to a vacuum exhaust part 50.

The gas supply/exhaust unit 2 will be described with reference to a vertical cross-sectional view of FIG. 3 and a bottom view of FIG. 4. When viewed in a plan view, the gas supply/exhaust unit 2 is formed in a fan shape extending in the circumferential direction of the rotary table 12 from the central side toward the peripheral side of the rotary table 12. A bottom surface of the gas supply/exhaust unit 2 is close to and faces the upper surface of the rotary table 12.

The gas supply/exhaust unit 2 is made of, for example, aluminum, and has gas ejection ports 21, an exhaust port 22, and a purge gas ejection port 23 formed in the bottom surface thereof. For the ease of distinction in the figure, in FIG. 4, a large number of dots are drawn so as to indicate the exhaust port 22 and the purge gas ejection port 23. A large number of gas ejection ports 21 are arranged in fan-shaped regions 24 inward of the peripheral portion of the bottom surface of the gas supply/exhaust unit 2. The gas ejection ports 21 eject dichlorosilane (DCS: $SiH_2Cl_2$) gas, which is a raw material gas containing silicon, downward in the form of a shower during the rotation of the rotary table 12 in the film-forming process so as to supply the DCS gas to the entire surface of the wafer W.

In the fan-shaped region 24, gas flow paths 25 are provided in the gas supply/exhaust unit 2 such that the DCS gas can be supplied to each of the gas ejection ports 21. The upstream sides of the gas flow paths 25 are connected to a DCS gas source 26 via pipes. Each pipe is provided with a flow rate adjustment part 27 including a mass flow controller, and a valve V27.

Next, the exhaust port 22 and the purge gas ejection port 23 will be described. The exhaust port 22 and the purge gas ejection port 23 are annularly opened in the peripheral portion of the bottom surface of the gas supply/exhaust unit 2 so as to surround the fan-shaped region 24 (see FIG. 4) and face the top surface of the rotary table 12. The purge gas ejection port 23 is located outside the exhaust port 22. A region positioned inward of the exhaust port 22 on the rotary table 12 constitutes an adsorption region R0 as a raw material gas supply region in which the DCS is adsorbed onto the surface of the wafer W. The purge gas ejection port 23 ejects, for example, an argon (Ar) gas as a purge gas onto the rotary table 12.

Figure 3:
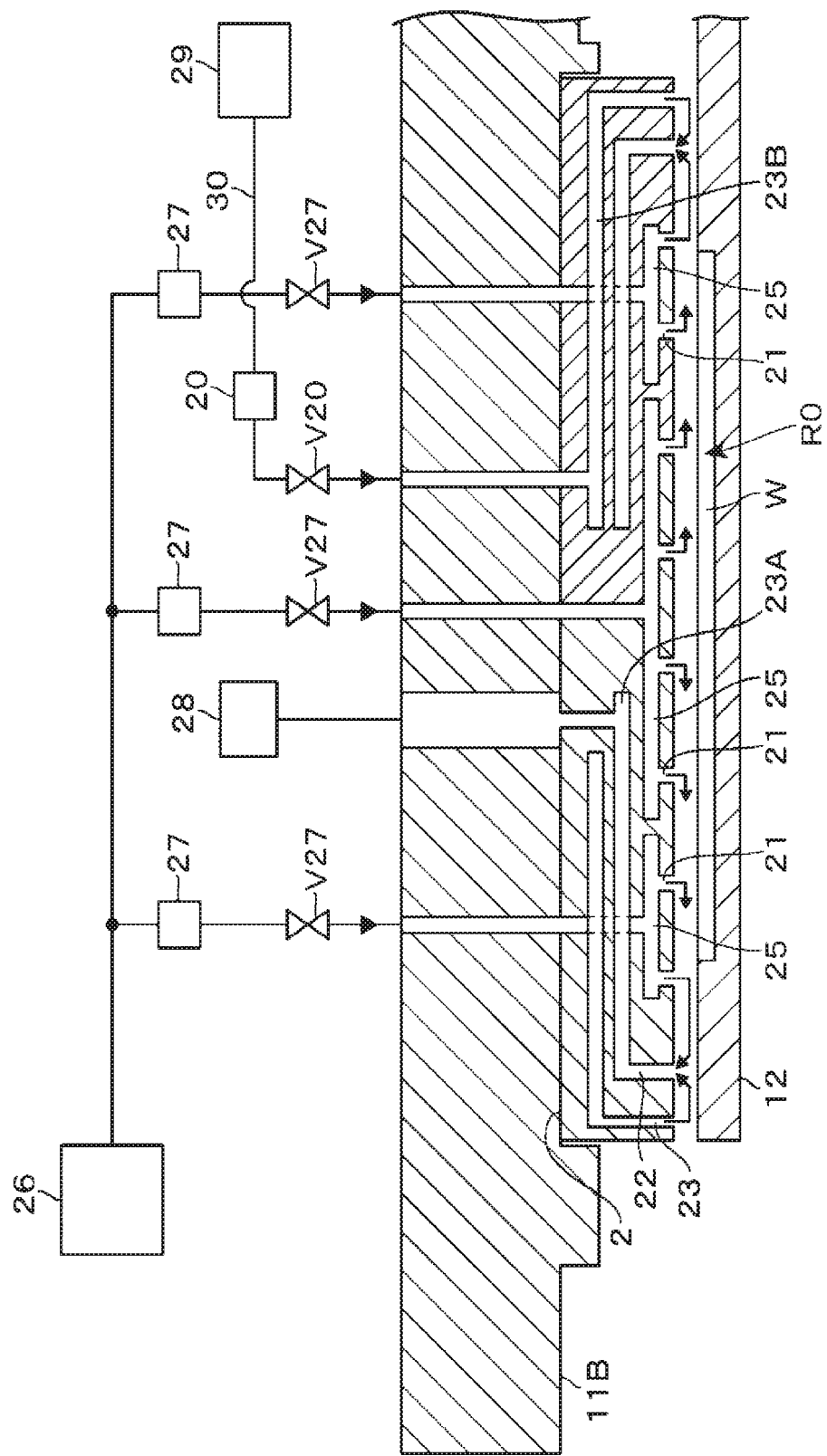
FIG. 3 is a vertical cross-sectional view illustrating an example of a gas supply/exhaust unit provided in the film forming apparatus.
Figure 4:
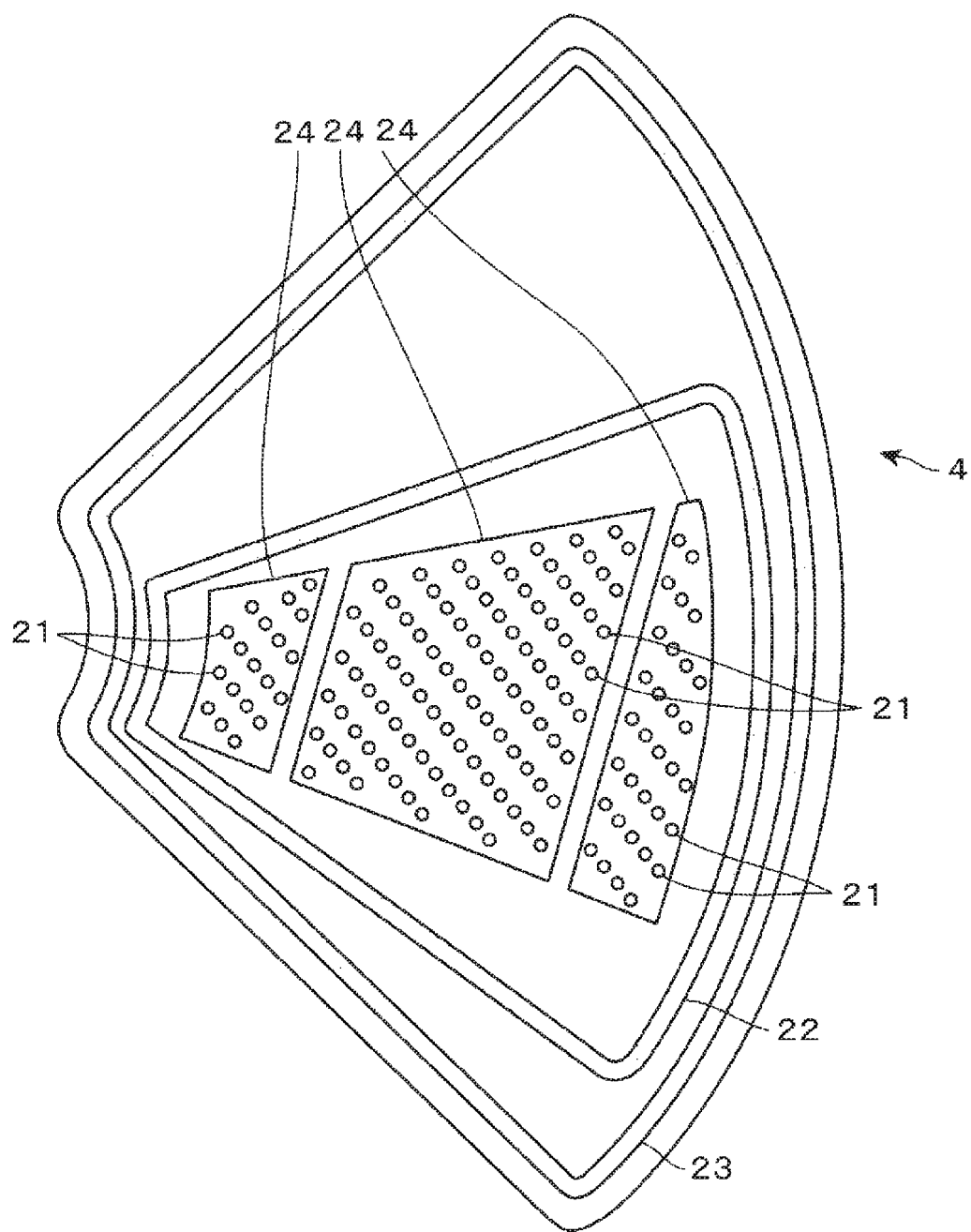
FIG. 4 is a bottom view illustrating the example of the gas supply/exhaust unit.

Reference numerals 23A and 23B in FIG. 3 denote gas flow paths that are provided in the gas supply/exhaust unit 2 to be partitioned from each other. An upstream end of the gas flow path 23A is connected to the exhaust port 22, and a downstream end of the gas flow path 23A is connected to an exhaust device 28. By the exhaust device 28, exhaust can be performed from the exhaust port 22. A downstream end of the gas flow path 23B is connected to the purge gas ejection port 23, and an upstream end of the gas passage 23B is connected to an Ar gas source 29. A flow rate adjustment part 20 and a valve V20 are provided in a pipe 30 that connects the gas flow path 23B and the Ar gas source 29.

During the film-forming process, the ejection of the raw material gas from the gas ejection ports 21, the exhaust of gas from the exhaust port 22, and the ejection of the purge gas from the purge gas ejection port 23 are simultaneously performed. As a result, as illustrated by arrows in FIG. 3, the raw material gas and the purge gas ejected towards the rotary table 12 are directed to the exhaust port 22 along the upper surface of the rotary table 12 and are exhausted from the exhaust port 22. By performing the ejection of the purge gas and the gas exhaust, an atmosphere in the adsorption region R0 can be separated from an external atmosphere so that the raw material gas can be supplied to the adsorption region R0 in a limitative manner.

Next, the plasma-forming units 3A to 3C will be described. In each of the plasma-forming units 3A and 3B, a $H_2$ gas as a plasma-forming gas is supplied to the bottom surface side thereof. The plasma-forming unit 3C has substantially the same configuration, except that the bottom surface side is supplied with an ammonia ($NH_3$) gas, which is a nitriding gas for nitriding the raw material gas, and a hydrogen ($H_2$) gas, as plasma-forming gases. The $H_2$ gas corresponds to a shaping gas. Here, the plasma-forming unit 3C will be described. The plasma-forming unit 3C is formed in a substantially fan shape that extends from the central side toward the outer peripheral side of the rotary table 12. As illustrated in FIG. 1, the plasma-forming unit 3C includes an antenna 31 for supplying microwaves. The antenna 31 includes a dielectric plate 32 and a metallic waveguide 33.

The waveguide 33 is provided on the dielectric plate 32, and includes an inner space 35 extending along a radial direction of the rotary table 12. On the lower side of the waveguide 33, a slot plate having a plurality of slot holes 36A is provided so as to come into contact with the dielectric plate 32. A microwave generator 37 is connected to the waveguide 33, and supplies microwaves of, for example, about 2.45 GHz, to the waveguide 33.

The plasma-forming unit 3C includes a gas ejection hole 41 and a gas ejection hole 42, each of which supplies a plasma-forming gas to the bottom surface side of the dielectric plate 32. The gas ejection hole 41 ejects the plasma-forming gas from the central side toward the outer peripheral side of the rotary table 12, and the gas ejection hole 42 ejects, for example, a mixed gas of the $H_2$ gas and the $NH_3$ gas, from the outer peripheral side toward the central side of the rotary table 12. In FIG. 1, reference numeral 43 denotes a $H_2$ gas source, and reference numeral 44 denotes an $NH_3$ gas source. The gas ejection hole 41 and the gas ejection hole 42 are connected to the $H_2$ gas source 43 and the $NH_3$ gas source 44, respectively, via a piping system including gas supply equipment 45. In the plasma-forming unit 3C, the microwaves supplied to the waveguide 33 pass through the slot holes 36A of the slot plate 36 so as to plasmarize a mixed gas of the $NH_3$ gas and the $H_2$ gas as a plasma-forming gas that is ejected below the dielectric plate 32. The plasma-forming unit 3C is configured to stop the supply of the $NH_3$ gas and to plasmarize only the $H_2$ gas. The plasma-forming units 3A and 3B have the same configuration as the plasma-forming unit 3C, except that the plasma-forming gas ejected below the dielectric plate 32 is the $H_2$ gas. Portions below the plasma-forming units 3A to 3C correspond to processing regions R1 to R3, respectively, As illustrated in FIG. 1, the film forming apparatus is provided with a controller 10 including a computer. The controller 10 stores a program. The program incorporates a group of steps for controlling the operation of each part of the film forming apparatus by transmitting a control signal to each part and executing the film-forming process described below. Specifically, the number of rotations of the rotary table 12 by the rotation mechanism 13, the supply of power to the heater 15, and the like are controlled by the program. This program is installed on the controller 10 from a storage medium, such as a hard disc, a compact disc, an optical-magneto disc, a memory card or the like.

Figures 5, 6:
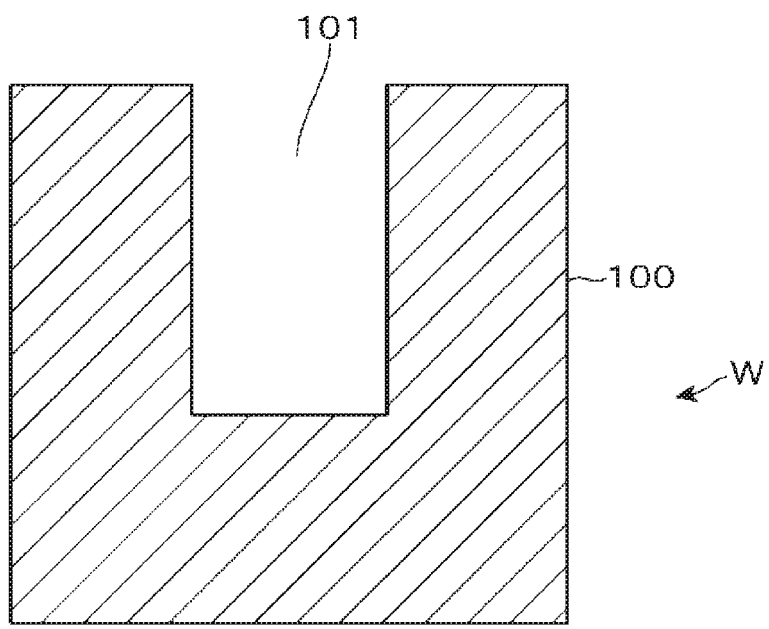
FIG. 5 is a time chart showing gases supplied in respective processing regions.
FIG. 6 is a cross-sectional view illustrating an example of a surface portion of a wafer on which a film-forming process is performed.

Next, the operation of the film forming apparatus according to the present disclosure will be described. FIG. 5 is a time chart showing ON/OFF of gas supply in the adsorption region R0 and each of the processing regions R1 to R3, types of supplied gases, and ON/OFF of the plasma-forming units 3A to 3C.

First, by an external substrate transfer mechanism (not illustrated), six sheets of wafers W are delivered to the respective recesses 14 of the rotary table 12 in cooperation between the lifting pins and the substrate transfer mechanism. FIG. 6 is a cross-sectional view illustrating an exemplary structure of the surface portion of the wafer W delivered to the rotary table 12. In the wafer W on which the film-forming process is performed, a groove-shaped recess pattern 101 is formed in a silicon substrate 100. The recess pattern 101 is formed to have a line width of 10 nm to 50 nm and a depth of 20 nm to 1,000 nm. The recess pattern 101 is formed to have a uniform width from the front surface of the wafer W to the bottom of the recess pattern 101.

In the following description, it is assumed that the front surface of the wafer W does not include an inner surface of the recess pattern 101. The groove-shaped portion formed in the silicon substrate 100 is referred to as the "recess pattern 101", and a groove-shaped gap portion remaining after a SiN film 102 is formed on the inner peripheral surface of the recess pattern 101 is referred to as a "recess 103". Further, in this example, the SiN film 102 is formed on the wafer W in multiple times. The SiN film 102 formed in a first round of film-forming step is referred to as a "SiN film 102A", and the SiN film 102 formed in a second round of film-forming step is referred to as a "SiN film 102B".

When the wafer W is delivered each recess 14, the gate valve provided in the transfer port 16 of the vacuum container 11 is closed so as to make the inside of the vacuum container 1 airtight. The wafer W placed on each recess 14 is heated by the heater 7 to, for example, 250 degrees C. or higher, more specifically, 550 degrees C. Then, by the exhaust of gas from the exhaust port 51, the inside of the vacuum container 11 becomes a vacuum atmosphere having a pressure of, for example, 2 torr (266.6 Pa). The rotary table 12 rotates clockwise at, for example, 1 rpm to 60 rpm.

Then, as shown in FIG. 5, the $H_2$ gas is supplied to each of the processing regions R1 and R2, and the $NH_3$ gas and the $H_2$ gas are supplied to the processing region R3. While each gas is supplied as described above, microwaves are supplied to the processing regions R1 to R3 by the respective plasma-forming units 3A to 3C. By the microwaves, plasma of the $H_2$ gas is formed in each of the processing regions R1 and R2, and plasma of the $H_2$ gas and the $NH_3$ gas is formed in the processing region R3. In addition, in the gas supply/exhaust unit 2, the DCS gas is ejected from the gas ejection ports 21, the Ar gas is ejected from the purge gas ejection port 23, and the exhaust of gas from the exhaust port 22 is performed.

Then, when each wafer W is located in the adsorption region R0 with the rotation of the rotary table 12 and the revolution of each wafer W by such a rotation, the DCS gas is supplied and adsorbed onto the surface of the wafer W. When the rotary table 12 further rotates and thus the wafer W reaches the processing region R3, the DCS adsorbed onto the wafer W reacts with $NH_3$ to generate SiN as a reaction product. In this example, when the wafer W passes below the processing regions R1 to R3, active species of hydrogen formed by plasmarizing the $H_2$ gas are supplied to the wafer W, so that chlorine (Cl) remaining on the wafer W is removed. By continuing the rotation of the rotary table 12 in this manner, the wafer W repeatedly passes through the adsorption region R0 and the processing regions R1 to R3 multiple times in sequence, so that SiN is deposited on the surface of the wafer W and the thickness of the SiN film 102 is increased.

Figure 7:
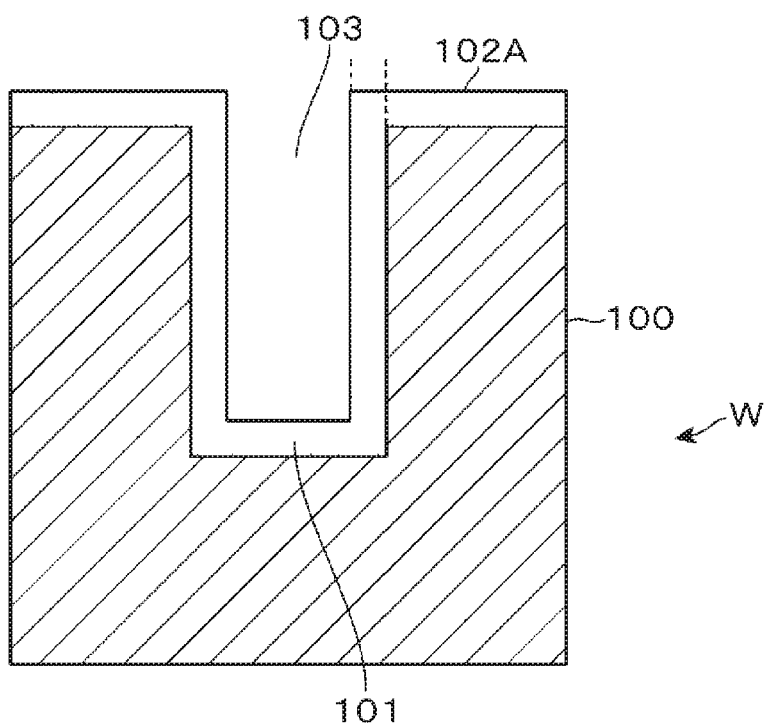
FIG. 7 is a cross-sectional view illustrating an example of a wafer on which a conformal SiN film is formed.

When the rotary table 12 is rotated, for example, for 1 minute after the supply of respective gases to the adsorption region R0 and the processing regions R1 to R3 is started and the SiN film formed on the wafer W has a desired film thickness, the ejection of the DCS gas from the gas supply/exhaust unit 2 is stopped. At the time at which the ejection of the DCS gas is stopped, a first round of SiN film 102A having a uniform film thickness in conformity to a surface shape of the wafer W (a conformal SiN film 102) is formed on the inner surface of the recess pattern 101 and the surface of the wafer W, as illustrated in FIG. 7. At this time, the upper end of the recess pattern 101 in the surface of the wafer W is not blocked by the SiN film 102A formed on the surface of the wafer W, but is opened. Since the first round of SiN film 102A has a uniform thickness, the shape of the recess 103, which corresponds to a gap remaining after the SiN film 102A is formed in the recess pattern 101, also has a uniform width from the surface of the wafer W to the bottom of the recess 103.

Then, in the state in which the supply of the DCS gas is stopped, the $H_2$ gas is supplied to each of the processing regions R1 to R3. In addition, microwaves are supplied to the processing regions R1 to R3 to activate and plasmarize the $H_2$ gas. In this state, the rotary table 12 is rotated at a rotation speed of, for example, 1 rpm to 120 rpm.

As a result, the plasma of $H_2$ gas is supplied to the SiN film 102A formed on the wafer W. As described above, when the plasma of $H_2$ gas is supplied to the SiN film, the SiN film 102A is modified and Cl contained in the film is released. When the supply of the plasma of $H_2$ gas is continued even after Cl is sufficiently released, components in the SiN film 102A are released so that the film density is increased and the film thickness is gradually reduced.

Here, the plasma of $H_2$ gas tends to be relatively easily deactivated. Therefore, when the plasma of $H_2$ gas is supplied to the wafer W in which the recess 103 remains, the sufficiently activated plasma of $H_2$ gas is easily supplied to a portion of a shallow position near the surface of the wafer W in the recess 103. On the other hand, in a portion of a deep position in the recess 103, the plasma of $H_2$ gas is deactivated before it reaches the deep position. Thus, the activated plasma of $H_2$ gas is hard to be supplied to deep position.

Figure 8:
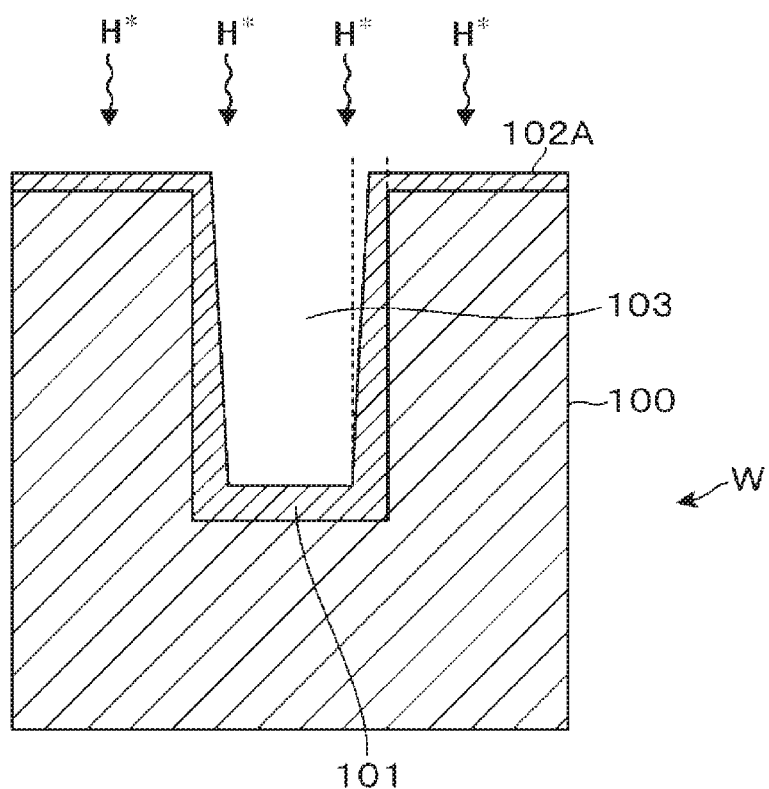
FIG. 8 is a cross-sectional view illustrating an example of the wafer on which the SiN film is shrunk.

Accordingly, as illustrated in FIG. 8, in the SiN film 102A formed in the recess pattern 101, the components are more easily released due to the plasma of $H_2$ gas from the portion of the shallow portion near the surface of the wafer W than from the portion of the deep position in the recess pattern 101. Thus, in the shallow portion, the film density tends to increase and the film thickness tends to decrease. Then, the SiN film 102A shrinks such that the film thickness becomes thinner from the bottom side to the upper side in the recess 103. Thus, as illustrated in FIG. 8, the width of the gap becomes wider at a position closer to the surface of the wafer, whereas the width of the recess 103 becomes narrower at a deeper position in the recess 103.

Figure 9:
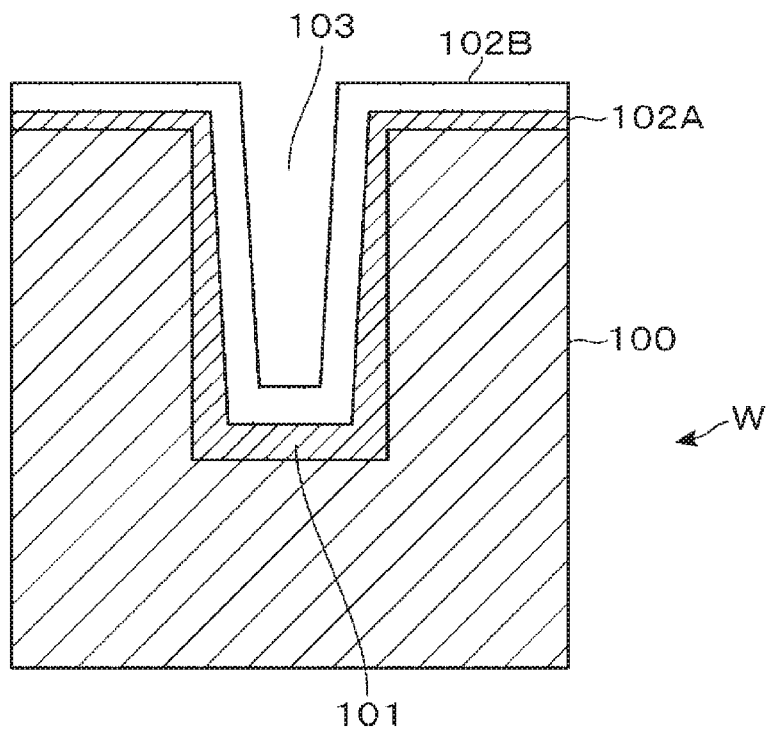
FIG. 9 is a cross-sectional view illustrating an example of the wafer on which a second round of conformal SiN film is formed.

As described above, after the film thickness of the SiN film 102A in the recess 103 at the surface side of the wafer W is decreased and the width of the gap is increased, the DCS gas is supplied from the gas supply/exhaust unit 2 to the adsorption region R0 as illustrated in the time chart of FIG. 5. In addition, the $H_2$ gas is supplied to each of the processing regions R2 and R3, the $NH_3$ gas and the $H_2$ gas are supplied to the processing region R1 so that plasma is generated in the processing regions R1 to R3. In this state, the rotary table 12 is rotated at the same rotation speed and for the same time as when the film-forming process of the SiN film 102A is performed. That is, the same film-forming process as the first round of film-forming process (the film-forming process of the SiN film 102A) is performed again. As a result, a SiN film 102B is formed in a conformal manner by a second round of film-forming process in conformity to the surface shape of the wafer W in which the recess 103 is formed (FIG. 9).

Figure 10:
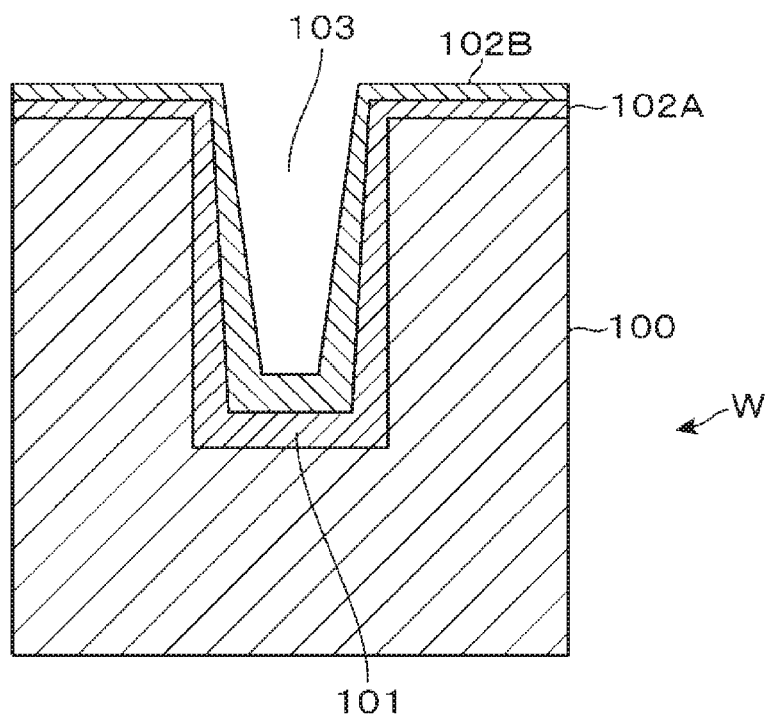
FIG. 10 is a cross-sectional view illustrating an example of the wafer on which the second round of conformal SiN film is shrunk.

Then, after forming the SiN film 102B, the supply of the DCS gas from the gas supply/exhaust unit 2 is stopped, the $H_2$ gas is supplied to the processing regions R1 to R3, and microwaves are supplied to the processing regions R1 to R3 so as to activate and plasmarize the $H_2$ gas. In this state, the rotary table 12 is rotated at the same rotation speed and for the same time as when the SiN film 102A is subjected to the shrinkage process. That is, the same shrinkage process as the first round of shrinkage process (the shrinkage process of the SiN film 102A) is performed again. As a result, the plasma of $H_2$ gas is supplied to the wafer W again, and the SiN film 102B is also shrunk such that the film thickness becomes thinner on the surface side of the wafer W than on the bottom side of the recess 103 (FIG. 10). The process of forming the conformal SiN film 102 and the process of supplying the plasma of $H_2$ gas to the wafer W so as to shrink the SiN film 102 are also subsequently repeated. As a result, the burying of the SiN film 102 in the recess pattern 101 proceeds.

Next, the reason why the shrinkage process is performed between the film-forming processes as described above will be described. For example, it is assumed that no shrinkage process is performed and a film-forming process is performed for a relatively long period of time so as to fill the recess pattern 101. In that case, as the SiN film 102 is formed, the recess 103 remaining in the recess pattern 101 gradually becomes narrower. At this time, as the width of the recess 103 becomes narrower, it becomes more difficult for gas to enter the recess 103. Thus, the SiN film 102 grows on the surface of the wafer W or on the upper end side of the recess pattern 101, but is hard to be formed on the bottom side of the recess pattern 101. As a result, the upper end of the recess pattern 101 may be closed by the SiN film 102 before the bottom side of the recess pattern 101 is completely filled. In this case, a gap called avoid or seam may be formed in the SiN film 102 buried in the recess pattern 101.

However, in this embodiment, after performing the film-forming process of the SiN film 102 and before performing the subsequent film-forming process of the SiN film 102, the previously-formed SiN film 102 is shaped such that the shrinkage rate thereof becomes larger on the upper side than on the lower side. Accordingly, in the subsequent round of film-forming process of the SiN film 102, the upper end side of the recess 103 becomes wider. Thus, the plasma of DCS gas as a film-forming gas or the plasma of $NH_3$ gas as a nitriding gas easily enters the recess 103. Therefore, the width of the recess pattern 101 on the upper end side is less likely to be narrower than the width of the recess pattern 101 on the bottom side. Therefore, similarly to the previous round of film-forming process, it is possible to form a conformal SiN film 102 even in the subsequent round of film-forming process. Thus, it is possible to form the SiN film in the recess pattern 101 while preventing the upper end side of the recess 103 from being blocked prior to the bottom side. Therefore, when the SiN film 102 is buried in the recess pattern 101, it is possible to prevent a void or seam from being formed in the SiN film 102.

Figure 11:
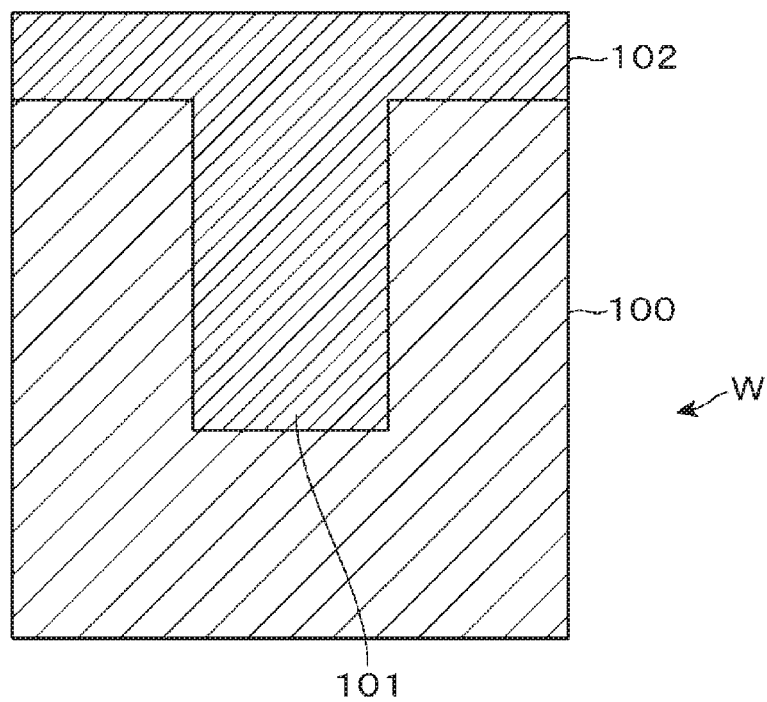
FIG. 11 is a cross-sectional view illustrating an example of the wafer in which a SiN film is buried in a recess pattern.
Figure 12:
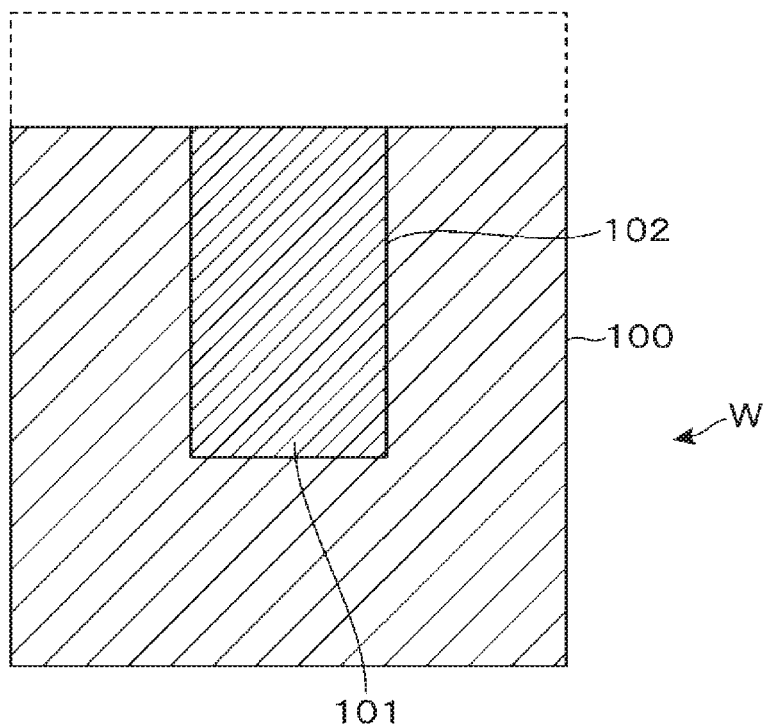
FIG. 12 is a cross-sectional view illustrating an example of the wafer whose surface is polished.
Figure 13:
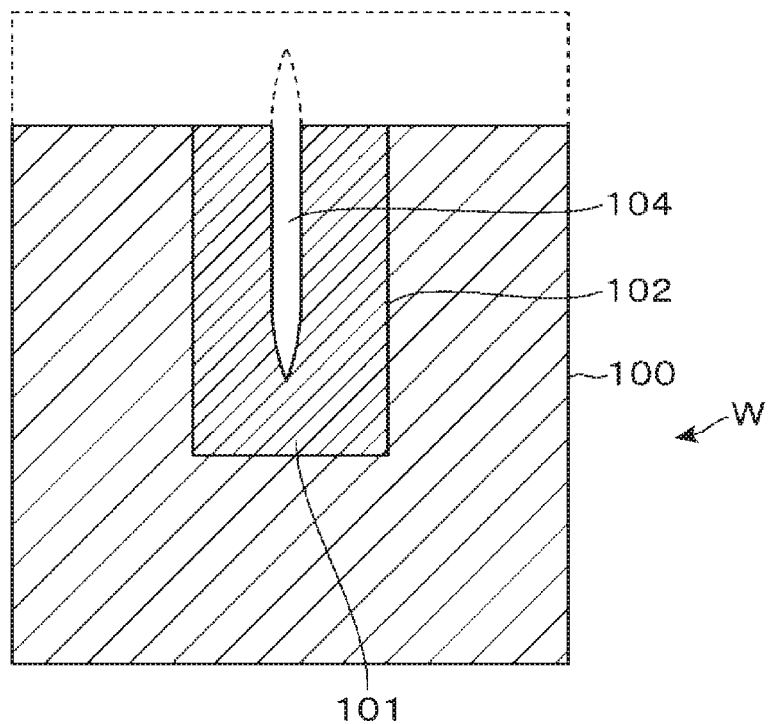
FIG. 13 is a cross-sectional view illustrating an example in which a surface of a wafer, on which a SiN film with a void or seam formed therein is formed, is polished.

When the film-forming process and the shrinkage process described above are repeated a predetermined number of times so that the SiN film 102 is completely buried in the recess pattern 101 (FIG. 11), the operation of the film forming apparatus is stopped and the wafer W is unloaded from the film forming apparatus by the external substrate transfer device. Then, the wafer W unloaded from the film forming apparatus is transferred to, for example, a polishing apparatus where the surface of the wafer W is polished as shown in FIG. 12. In the case in which the SiN film 102 buried in the recess pattern 101 has a gap such as a void or seam, when the SiN film 102 on the upper surface of the wafer W is removed through the polishing, the gap may be exposed on the surface of the wafer W as a recess 104, as illustrated in FIG. 13.

Thereafter, the wafer W is transferred to, for example, a wet-etching apparatus where the wafer W is subjected to a wet-etching process. When the recess 104 is exposed, an etching liquid may enter the recess 104 so that the wall portion of the SiN film 102 forming the recess 104 may be eroded. In the film forming method according to this embodiment, since it is possible to prevent generation of the void and seam in the SiN film 102, it is possible to prevent the SiN film 102 from being etched when the polishing process and the wet-etching process are performed after the film-forming process.

In the above-described embodiment, the process of forming the conformal SiN film 102 on the wafer W in which the recess pattern 101 is formed, and the process of supplying plasma to the wafer W so as to shrink the SiN film 102 such that the recess 103 has a V-shaped cross section, are repeated. This makes it is possible to prevent the formation of a gap in the SiN film 102 buried in the recess pattern 101, thus improving the burying property.

In this embodiment, in the process of forming the SiN film 102 on the wafer W, the plasma of DCS gas and the plasma of $NH_3$ gas are sequentially supplied to the wafer W so as to form the SiN film 102, and further the plasma of $H_2$ gas is supplied to modify the SiN film 102. That is, the plasma of $H_2$ gas is supplied to the wafer W during the film-forming process as in the shrinkage process. However, since the plasma of $H_2$ gas is supplied while the SiN film is formed in the film-forming process, the action of shrinking the SiN film 102 with the plasma of $H_2$ gas such that the SiN film has the shape described in the aforementioned shrinkage process, is suppressed. Thus, as described above, the conformal SiN film 102 is formed during the film-forming process.

The film-forming process and the shrinkage process are repeated as described above. In one round of shrinkage process in such a repetitive operation, it is preferable to supply the plasma of $H_2$ gas to the wafer W, for example, for 1 minute or more, such that the film is shaped as described above. In the subsequent round of film-forming process, from the viewpoint of facilitating the gases to enter the recess 103, it is preferable to shrink the SiN film 102 such that the thickness of the SiN film 102 near the surface of the wafer W becomes smaller than the thickness of the SiN film 102 on the bottom side of the recess pattern 101 by 0.2 nm or more. That is, it is preferable to perform one round of shrinkage process such that a difference in film thickness between the position where the shrinkage rate is highest and the position where the shrinkage rate is lowest in the recess 103 is 0.2 nm or more. In addition, it is preferable to form the conformal SiN film 102 at a film thickness of 2 nm or more in one round of film-forming process during the repetition of the film-forming process and the shrinkage process.

The conformal SiN film 102 may be a film having a substantially uniform film thickness regardless of the depth position in the recess pattern 101. As for the thickness of the SiN film 102 at each depth position in the recess pattern 101, assuming that the thickness of the thickest portion is $t_{max}$ and the thickness of the thinnest portion is $t_{min}$, when the film thickness ratio $(t_{min}/t_{max})$ is 0.9 or more, the SiN film 102 may be regarded as the conformal SiN film 102.

The above-described shrinkage process may be performed under the processing conditions in which the effect of plasma on the upper side of the recess pattern 101 is larger than that on the lower side. For that purpose, it is preferable to use plasma of a gas having a shorter deactivation time than that of the plasma of $NH_3$ gas used in the film-forming process.

The processing conditions of the shrinkage process that make the action on the upper side of the recess pattern 101 larger than that on the lower side are not limited to the condition in which the type of the gas plasmarized in the shrinkage process is different from the type of the gas plasmarized and used in the film-forming process, as described above. For example, the same gas as the gas supplied to the processing regions R1 to R3 during the film-forming process may be supplied to the processing regions R1 to R3 and may be plasmarized during the shrinkage process. However, the above-described shrinkage action may be obtained by setting power supplied from the microwave generator 37 to the waveguide 33 to be different between the film-forming process and the shrinkage process. In the case of changing the power in such a manner, for example, the power during the shrinkage process may be set to be higher than that during the film-forming process.

An internal pressure of the vacuum container 11 may be changed instead of changing the power supplied during the film-forming process and the shrinkage process as described above. Specifically, the pressure during the shrinkage process may be set to be higher than that during the film-forming process. However, the change of the pressure may cause a problem in that it takes time to change the pressure. Accordingly, it is preferable to use different types of gases during the film-forming process and the shrinkage process as described above from the viewpoint of simplifying the configuration of the apparatus and increasing throughput. Even when the power supply and the pressure are changed as described above, the supply of the DCS gas to the adsorption region R0 is set to be stopped during the shrinkage process.

Figure 14:
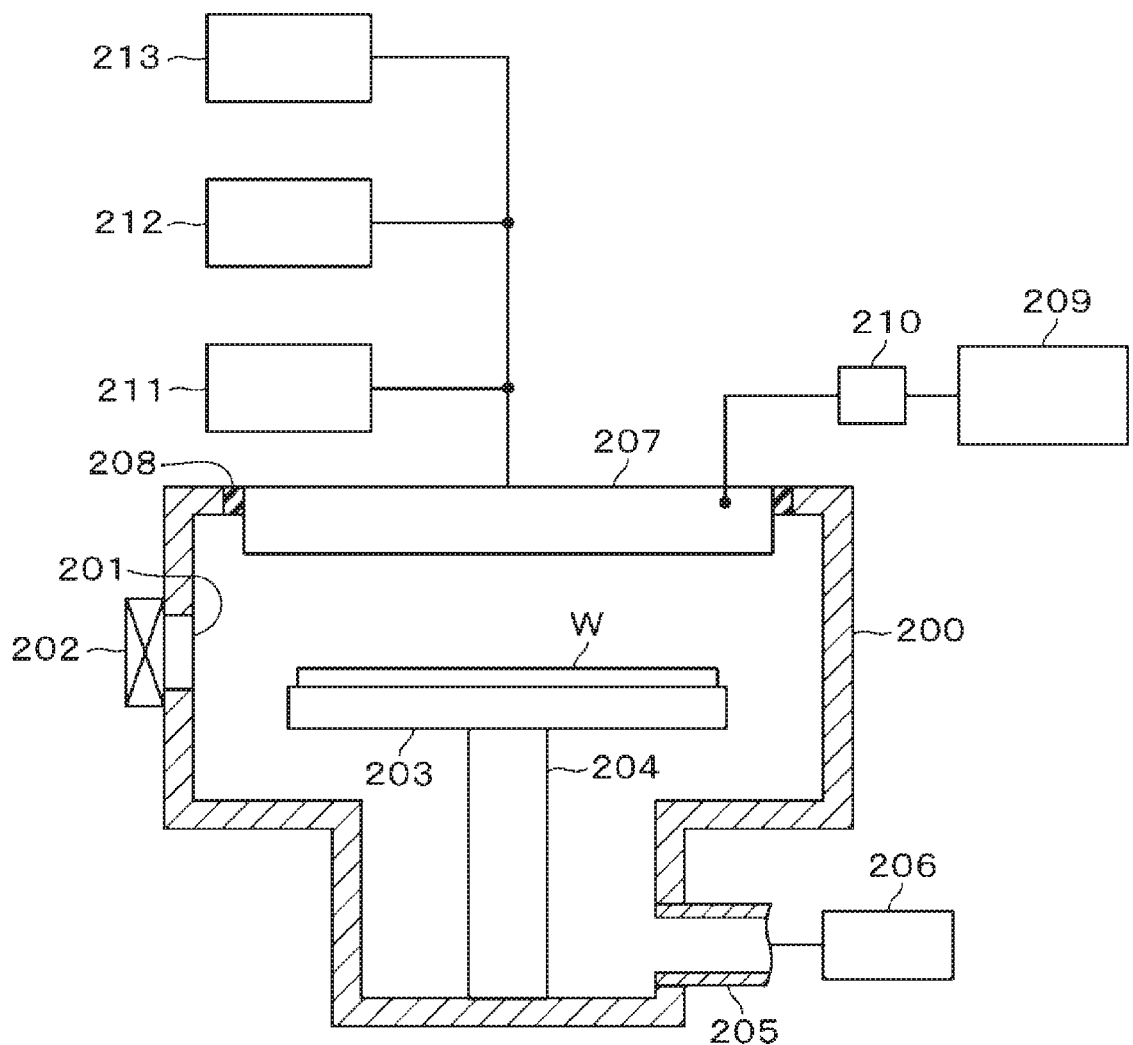
FIG. 14 is a cross-sectional view showing an example of a film forming apparatus according to another embodiment of the present disclosure.

The film forming method according to the present disclosure may be performed using an apparatus that processes only one sheet of wafer W stored in the processing container, that is, a single-wafer apparatus. The film forming apparatus, which is a single-wafer apparatus, includes, for example, a processing container 200 as illustrated in FIG. 14. A stage 203 for holding a wafer W in a substantially horizontal posture is provided inside the processing container 200 via a support column 204. Reference numeral 201 denotes a loading/unloading port for wafer W, which is provided in the side surface of the processing container 200. Reference numeral 202 denotes a gate valve. An evacuation part 206 is connected to the processing container 200 via an exhaust pipe 205.

On a ceiling surface of the processing container 200, a metal-made shower head 207 for supplying gas toward the wafer W is provided via an insulating member 208. A DCS gas supply part 211, an $NH_3$ gas supply part 212, and a Hz gas supply part 213 are connected to the shower head 207 so as to supply gases toward the wafer W placed on the stage 203. A high-frequency power supply 209 is connected to the shower head 207 via a matcher 210, and is configured to form a high-frequency electric field inside the processing container 200. Even in such a film forming apparatus, it is possible to supply the plasma of $H_2$ gas after forming the SiN film 102 on the wafer W. Thus, the same effects as those in the above embodiment can be obtained. In some embodiments, the DCS gas and the $NH_3$ gas may be simultaneously supplied into the processing container 200 and the film-forming process may be performed using a chemical vapor deposition (CVD) as long as the above-mentioned conformal SiN film 102 can be formed. In addition, the film-forming process may be performed without plasmarizing the $NH_3$ gas supplied into the processing container 200.

According to the present disclosure in some embodiments, when forming a film so as to fill a recess pattern formed in a surface of a substrate, it is possible to fill the recess pattern with no gap.

From the foregoing, it should be noted that the embodiments disclosed herein are exemplary in all respects and are not restrictive. The above-described embodiments may be omitted, replaced or modified in various forms without departing from the scope and spirit of the appended claims.

What is claimed is:

1. A method of forming a silicon nitride film on a substrate having a recess pattern formed in a surface of the substrate, the method comprising:
   forming the silicon nitride film in conformity to the surface of the substrate by supplying each of a raw material gas containing silicon and a nitriding gas for nitriding the raw material gas into a processing container in which the substrate is accommodated;
   shrinking the silicon nitride film such that a thickness of the silicon nitride film is reduced from a bottom side of the recess pattern toward an upper side of the recess pattern by supplying a plasmarized shaping gas for shaping the silicon nitride film to the substrate in a state in which the supply of the raw material gas containing silicon into the processing container is stopped; and
   burying the silicon nitride film in the recess pattern by alternately and repeatedly performing the forming the silicon nitride film and the shrinking the silicon nitride film,
   wherein the plasmarized shaping gas is a plasmarized hydrogen gas.

2. The method of claim 1, wherein the nitriding gas is a plasmarized nitriding gas.

3. The method of claim 2, wherein the nitriding gas is a plasmarized ammonia gas.

4. The method of claim 3, wherein, in the forming the silicon nitride film, the silicon nitride film is formed to have a thickness of 2 nm or more, and in the shrinking the silicon nitride film, a reduced thickness of the silicon nitride film on the upper side of the recess pattern is 0.2 nm or more larger than a reduced thickness of the silicon nitride film on the bottom side of the recess pattern.

5. The method of claim 1, wherein, in the forming the silicon nitride film, the silicon nitride film is formed to have a thickness of 2 nm or more, and in the shrinking the silicon nitride film, a reduced thickness of the silicon nitride film on the upper side of the recess pattern is 0.2 nm or more larger than a reduced thickness of the silicon nitride film on the bottom side of the recess pattern.

6. A film forming apparatus for forming a silicon nitride film on a substrate having a recess pattern formed in a surface of the substrate, comprising:
   a processing container in which a stage on which the substrate is placed is provided;
   a raw material gas supply part configured to supply a raw material gas containing silicon to the substrate placed on the stage;
   a nitriding gas supply part configured to supply a nitriding gas for nitriding the raw material gas to the substrate placed on the stage;
   a shaping gas supply part configured to supply a shaping gas for shaping the silicon nitride film to the substrate;
   a plasma-forming mechanism configured to plasmarize a gas supplied to the processing container; and
   a controller configured to output a control signal for executing steps of:
   forming the silicon nitride film in conformity to the surface of the substrate by supplying each of the raw material gas containing silicon and the nitriding gas into the processing container in which the substrate is accommodated;
   shrinking the silicon nitride film such that a thickness of the silicon nitride film is reduced from a bottom side of the recess pattern toward an upper side of the recess pattern by supplying the shaping gas into the processing container and plasmarizing the shaping gas in a state in which the supply of the raw material gas containing silicon into the processing container is stopped; and
   burying the silicon nitride film in the recess pattern by alternately and repeatedly performing the forming the silicon nitride film and the shrinking the silicon nitride film,
   wherein the shaping gas is a hydrogen gas.

7. The film forming apparatus of claim 6, wherein the stage is a rotary table configured to cause the substrate of the stage to revolve,
   wherein a first processing region to which the raw material gas containing silicon is supplied and a second processing region which has an atmosphere separated from an atmosphere of the first processing region and to which the nitriding gas and the shaping gas are supplied are arranged on the rotary table in a spaced-apart relationship with each other in a rotational direction of the rotary table,
   wherein the plasma-forming mechanism is configured to plasmarize the nitriding gas and the shaping gas in the second processing region,
   wherein the step of forming the silicon nitride film is a step of causing the substrate to revolve while supplying the raw material gas containing silicon and the plasmarized nitriding gas to the first processing region and the second processing region, respectively, and
   wherein the step of shrinking the silicon nitride film is a step of supplying the plasmarized shaping gas to the second processing region.

* * * * *